US012782443B2

(12) United States Patent
Niu et al.

(10) Patent No.: US 12,782,443 B2
(45) Date of Patent: Nov. 3, 2026

(54) LITHIUM-ION BATTERY HEALTH MANAGEMENT BASED ON SINGLE PARTICLE MODEL

(71) Applicant: University of South Carolina, Columbia, SC (US)

(72) Inventors: Guangxing Niu, West Columbia, SC (US); Bin Zhang, Irmo, SC (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 17/550,045

(22) Filed: Dec. 14, 2021

(65) Prior Publication Data

US 2022/0187375 A1 Jun. 16, 2022

Related U.S. Application Data

(60) Provisional application No. 63/125,030, filed on Dec. 14, 2020.

(51) Int. Cl.
*G01R 31/367* (2019.01)
*G01R 31/392* (2019.01)

(52) U.S. Cl.
CPC ......... *G01R 31/367* (2019.01); *G01R 31/392* (2019.01)

(58) Field of Classification Search
CPC ............................ G01R 31/367; G01R 31/392
See application file for complete search history.

(56) References Cited

U.S. PATENT DOCUMENTS 8,332,342 B1 * 12/2012 Saha .................... G01R 31/392 706/45
2013/0311115 A1 * 11/2013 Chaturvedi .......... G01R 31/367 702/63
2017/0222449 A1 * 8/2017 MirTabatabaei .. H01M 10/4257
2018/0198300 A1 * 7/2018 Howey ............... H01M 10/045
2019/0162791 A1 * 5/2019 Farag ................ H01M 10/0525

OTHER PUBLICATIONS

M. F. Samadi, S. M. M. Alavi and M. Saif, "Online state and parameter estimation of the Li-ion battery in a Bayesian framework," 2013 American Control Conference, Washington, DC, USA, 2013, pp. 4693-4698, doi: 10.1109/ACC.2013.6580563. (Year: 2013).*
M. F. Samadi, S. M. M. Alavi and M. Saif, "An electrochemical model-based particle filter approach for Lithium-ion battery estimation," 2012 IEEE 51st IEEE Conference on Decision and Control (CDC), Maui, HI, USA, 2012, pp. 3074-3079, doi: 10.1109/CDC.2012.6426009. (Year: 2012).*
N. Lotfi, J. Li, R. G. Landers and J. Park, "Li-ion Battery State of Health Estimation based on an improved Single Particle model," 2017 American Control Conference (ACC), Seattle, WA, USA, 2017, pp. 86-91, doi: 10.23919/ACC.2017.7962935. (Year: 2017).*

* cited by examiner

*Primary Examiner* — Raymond L Nimox
(74) *Attorney, Agent, or Firm* — Douglas L. Lineberry; Maynard Nexsen PC

(57) ABSTRACT

Described herein are methods of Lithium battery health management based on a single particle model as shown and described herein to provide for reliable and accurate battery factor estimation to ensure efficient system operation.

8 Claims, 12 Drawing Sheets

TABLE 1

Battery reaction parameters

| Parameter | | | |
|---|---|---|---|
| $R_c$ | Contact impedance | $c_{e,0}$ | Liquid initial concentration |
| $D_e$ | Liquid concentration diffusion coefficient | $c_s^{\pm}$ | Solid phase concentration |
| $D_e^{eff}$ | Liquid phase effective diffusion coefficient | $c_{ss}^{\pm}$ | Solid surface concentration |
| $D_s^{\pm}$ | Solid phase concentration diffusion coefficient | $c_{s,max}^{\pm}$ | Solid concentration |
| $D_{s,0}^{\pm}$ | Solid phase concentration initial diffusion coefficient | $i_0^{\pm}$ | Exchange current density |
| $E_{act}$ | Activation energy | $k_0^{\pm}$ | Electrolyte initial conductivity |
| $\mathcal{F}$ | Faraday constant | $k^{eff}$ | Electrolyte effective conductivity |
| $I$ | Working current | $k_e$ | Electrolyte conductivity |
| $c_e^j$ | Liquid concentration in different regions | $\sigma^{\pm}$ | Solid phase conductivity |
| $j_r^j$ | Lithium ion reaction current density | $\sigma^{eff}$ | Effective solid phase conductivity |
| $\alpha$ | Charge transfer coefficient | $\beta$ | Activity coefficient |

FIGURE 7

TABLE 2

Battery geometric parameters

| Parameter | |
|---|---|
| $A$ | Electrode area |
| $\mathcal{F}$ | Faraday constant |
| $L_j$ | Battery thickness in different regions |
| $r$ | Radial coordinate |
| $R_s^{\pm}$ | Active material particle radius |
| $L_n$ | Negative electrode thickness |
| $L_s$ | Positive electrode thickness |
| $L_p$ | Separator thickness |

FIGURE 8

Typical discharge curve of a battery, showing the influence of the various types of polarization.

LITHIUM-ION BATTERY HEALTH MANAGEMENT BASED ON SINGLE PARTICLE MODEL

TECHNICAL FIELD

The subject matter disclosed herein is generally directed to Lithium-ion battery health management based on single particle model to provide for reliable and accurate battery factor estimation to ensure efficient system operation.

BACKGROUND

The traditional battery SOC (state-of-charge) and SOH (state-of-health) estimation approaches are mainly based on an equivalent circuit model, which has low accuracy. Lithium-ion batteries are widely used in many applications due to the advantage in high energy density, high cycle life, low self-discharge and less weight. With the development of new energy industry, lithium-ion batteries can be found in electric vehicles, energy storage systems, solar power system, etc. The global market size is estimated to grow from USD $44.2 billion in 2020 to USD $94.4 billion by 2025. Accurate and reliable lithium-ion battery SOC and SOC estimation has a significant effect on the safety and reliability of systems. Besides, it can ensure the efficient operation of the systems. The current disclosure seeks to improve Lithium-battery life and performance and methods for improving same.

Citation or identification of any document in this application is not an admission that such a document is available as prior art to the present disclosure.

SUMMARY

The above objectives are accomplished according to the present disclosure by providing in one embodiment, a method for describing battery behavior. The method may include employing at least one particle swarm optimization parameter; employing a Lebesgue sampling-based Bayesian estimation framework; and estimating via a single particle model at least one state-of-charge factor and at least one state-of-health factor for a battery. Further, the method may be employed with a lithium-ion battery. Still further, the method may generate a single particle model to describe a behavior of a battery. Yet still, the model may be employed on at least one embedded system. Yet further, the model may be employed on at least one microprocessor. Still again, only a liquid phase and a solid phase in the battery may be evaluated. Yet again still, the solid phase may be described via:

Spherical Diffusion Equation—Fick Second Law $$\frac{\partial c_s(r,t)}{\partial t} = \frac{1}{r^2}\frac{\partial}{\partial r}\left(D_{s,i}(T)r^2\frac{\partial c_s(r,t)}{\partial r}\right)$$

$$\frac{\partial c_s(r,t)}{\partial r}\Big|_{r=0} = 0$$

$$D_{s,i}\frac{\partial c_s(r,t)}{\partial r}\Big|_{r=R_{s,j}} = -j_i(t)$$

Reaction Rate $$j_- = \frac{+I}{a_{s,-}\mathcal{F}A\delta_-} \quad j_+ = \frac{-I}{a_{s,+}\mathcal{F}A\delta_+}$$

Solid Phase Potential $$\frac{\partial \Phi_s(x,t)}{\partial x} = \frac{-i_s(x,t)}{\sigma^{eff}} = \frac{i_e(x,t) - I(t)}{\sigma^{eff}}$$

$$i_e + i_s = I.$$

Further still, the liquid phase may be described via:

Evolution of Lithium Concentration $$\varepsilon_e\frac{\partial c_e}{\partial t} = D_e^{eff}\frac{\partial^2 c_e}{\partial x^2} + \frac{1-t_+^0}{\mathcal{F}}j^{Li}$$

$$\frac{\partial c_e}{\partial x}\Big|_{x=0^-} = \frac{\partial c_e}{\partial x}\Big|_{x=0^+} = 0$$

Electrolyte Potential $$k^{eff}\frac{\partial \phi_e}{\partial x} - k_D^{eff}\frac{\partial \ln c_e}{\partial x} + i_e = 0$$

$$k_D^{eff} = \frac{2RTk^{eff}}{\mathcal{F}}\left(t_+^0 - 1\right)\left(1 + \frac{d\ln f_\pm}{d\ln c_e}\right).$$

In a further embodiment, a method for simulating behavior in a lithium-ion battery is provided. The method may include using a single particle model to simulate lithium-ion battery behavior, employing particle swarm optimization to identify at least one parameter of the single particle model, and implementing the single particle model in a Lebesgue sampling and Bayesian estimation framework to estimate at least state of charge and state of health for the lithium-ion battery. Still further, the model may generate a single particle model to describe a behavior of a battery. Yet again, the model may be employed on at least one embedded system. Yet still, the model may be employed on at least one microprocessor. Further again, only a liquid phase and a solid phase in the battery may be evaluated. Further yet, the solid phase may be described via:

Spherical Diffusion Equation—Fick Second Law $$\frac{\partial c_s(r,t)}{\partial t} = \frac{1}{r^2}\frac{\partial}{\partial r}\left(D_{s,i}(T)r^2\frac{\partial c_s(r,t)}{\partial r}\right)$$

$$\frac{\partial c_s(r,t)}{\partial r}\Big|_{r=0} = 0$$

$$D_{s,i}\frac{\partial c_s(r,t)}{\partial r}\Big|_{r=R_{s,j}} = -j_i(t)$$

Reaction Rate $$j_- = \frac{+I}{a_{s,-}\mathcal{F}A\delta_-} \quad j_+ = \frac{-I}{a_{s,+}\mathcal{F}A\delta_+}$$

Solid Phase Potential $$\frac{\partial \Phi_s(x,t)}{\partial x} = \frac{-i_s(x,t)}{\sigma^{eff}} = \frac{i_e(x,t) - I(t)}{\sigma^{eff}}$$

$$i_e + i_s = I.$$

Yet still further, the liquid phase may be described via:

Evolution of lithium concentration $$\varepsilon_e \frac{\partial c_e}{\partial t} = D_e^{eff} \frac{\partial^2 c_e}{\partial x^2} + \frac{1 - t_+^0}{\mathcal{F}} j^{Li}$$

$$\frac{\partial c_e}{\partial x} |_{x=0^-} = \frac{\partial c_e}{\partial x} |_{x=0^+} = 0$$

Electrolyte Potential $$k^{eff} \frac{\partial \phi_e}{\partial x} - k_D^{eff} \frac{\partial \ln c_e}{\partial x} + i_e = 0$$

$$k_D^{eff} = \frac{2RTk^{eff}}{\mathcal{F}} (t_+^0 - 1)\left(1 + \frac{d \ln f_\pm}{d \ln c_e}\right).$$

These and other aspects, objects, features, and advantages of the example embodiments will become apparent to those having ordinary skill in the art upon consideration of the following detailed description of example embodiments.

BRIEF DESCRIPTION OF THE DRAWINGS

An understanding of the features and advantages of the present disclosure will be obtained by reference to the following detailed description that sets forth illustrative embodiments, in which the principles of the disclosure may be utilized, and the accompanying drawings of which:

FIG. 7 shows Table 1, Battery Reaction Parameters.

FIG. 8 shows Table 2, Battery Geometric Parameters.

Figure 1:
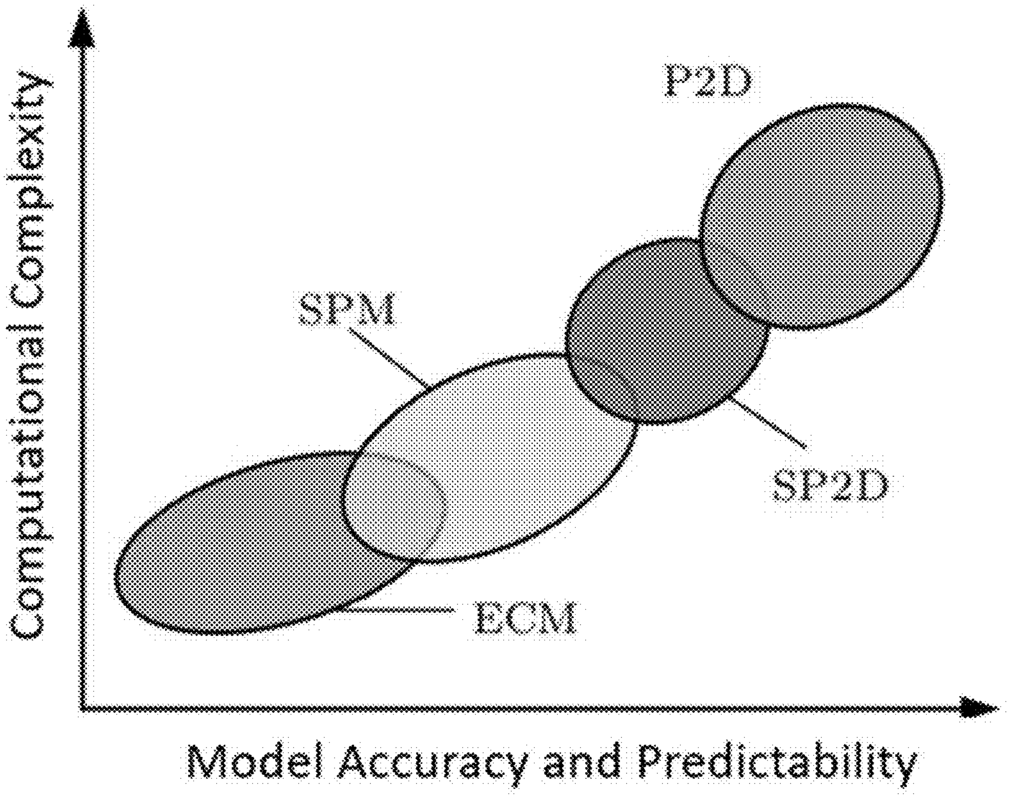
FIG. 1 shows a comparison of computational complexity vis-à-vis model accuracy and predictability.

The figures herein are for illustrative purposes only and are not necessarily drawn to scale.

DETAILED DESCRIPTION OF THE EXAMPLE EMBODIMENTS

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Where a range is expressed, a further embodiment includes from the one particular value and/or to the other particular value. The recitation of numerical ranges by endpoints includes all numbers and fractions subsumed within the respective ranges, as well as the recited endpoints. Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', 'less than y', and 'less than z'. Likewise, the phrase 'about x, y, z, or greater' should be interpreted to include the specific ranges of 'about x', 'about y', and 'about z' as well as the ranges of 'greater than x', 'greater than y', and 'greater than z'. In addition, the phrase "about 'x' to 'y'", where 'x' and 'y' are numerical values, includes "about 'x' to about 'y'".

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the singular forms "a", "an", and "the" include both singular and plural referents unless the context clearly dictates otherwise.

As used herein, "about," "approximately," "substantially," and the like, when used in connection with a measurable variable such as a parameter, an amount, a temporal duration, and the like, are meant to encompass variations of and from the specified value including those within experimental error (which can be determined by e.g. given data set, art accepted standard, and/or with e.g. a given confidence interval (e.g. 90%, 95%, or more confidence interval from the mean), such as variations of +/−10% or less, +/−5% or less, +/−1% or less, and +/−0.1% or less of and from the specified value, insofar such variations are appropriate to perform in the disclosure. As used herein, the terms "about," "approximate," "at or about," and "substantially" can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

The term "optional" or "optionally" means that the subsequent described event, circumstance or substituent may or may not occur, and that the description includes instances where the event or circumstance occurs and instances where it does not.

As used herein, the terms "weight percent," "wt %," and "wt. %," which can be used interchangeably, indicate the percent by weight of a given component based on the total weight of a composition of which it is a component, unless otherwise specified. That is, unless otherwise specified, all wt % values are based on the total weight of the composition. It should be understood that the sum of wt % values for all components in a disclosed composition or formulation are equal to 100. Alternatively, if the wt % value is based on the total weight of a subset of components in a composition, it should be understood that the sum of wt % values the specified components in the disclosed composition or formulation are equal to 100.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s). Reference throughout this specification to "one embodiment", "an embodiment," "an example embodiment," means that a particular feature, structure or characteristic described in connection with the embodiment is included in at least one embodiment of the present disclosure. Thus, appearances of the phrases "in one embodiment," "in an embodiment," or "an example embodiment" in various places throughout this specification are not necessarily all referring to the same embodiment, but may. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the disclosure. For example, in the appended claims, any of the claimed embodiments can be used in any combination.

All patents, patent applications, published applications, and publications, databases, websites and other published materials cited herein are hereby incorporated by reference to the same extent as though each individual publication, published patent document, or patent application was specifically and individually indicated as being incorporated by reference.

The current disclosure seeks to develop a particle swarm optimization based parameter identification approach for a battery SP (Single Particle) model. Battery testing data estimates the parameters of the SP model, which can describe the behavior of lithium-ion battery accurately. The current disclosure seeks to develop SP based SOC (state-of-charge) and SOH (state-of-health) estimation in Lebesgue sampling-based Bayesian estimation framework. Battery test experiments validate the accuracy and efficiency of the approach. SP model is widely used in simulating the behavior of lithium-ion battery. SP model can accurately describe the behavior of lithium-ion batteries, Utilizing SP model in Bayesian estimation for battery SOC and SOH combines accurate battery modeling of SP model and the low computational cost of Bayesian approach in Lebesgue Sampling (LS). Compared with traditional approach, the proposed can significantly reduce the computational cost and improve computational efficiency.

SP model is used in simulating the behavior of lithium-ion battery. Particle swarm optimization is used to identify the parameters of the SP model. SP is implemented in the LS and Bayesian estimation framework to estimate the battery SOC and SOH online. Due to integration with LS, the computation is significantly reduced. This enables deployment of the proposed approach on low-cost hardware such as embedded systems or microprocessors.

The SP model can accurately describe the behavior of lithium-ion batteries. The proposed SP model in LS-based Bayesian approach combines the accurate SP model and the low computational cost of LS. The proposed approach presents a novel accurate SOC and SOH estimation approach for lithium-ion batteries with better performance and higher computational efficiency.

Figure 2:
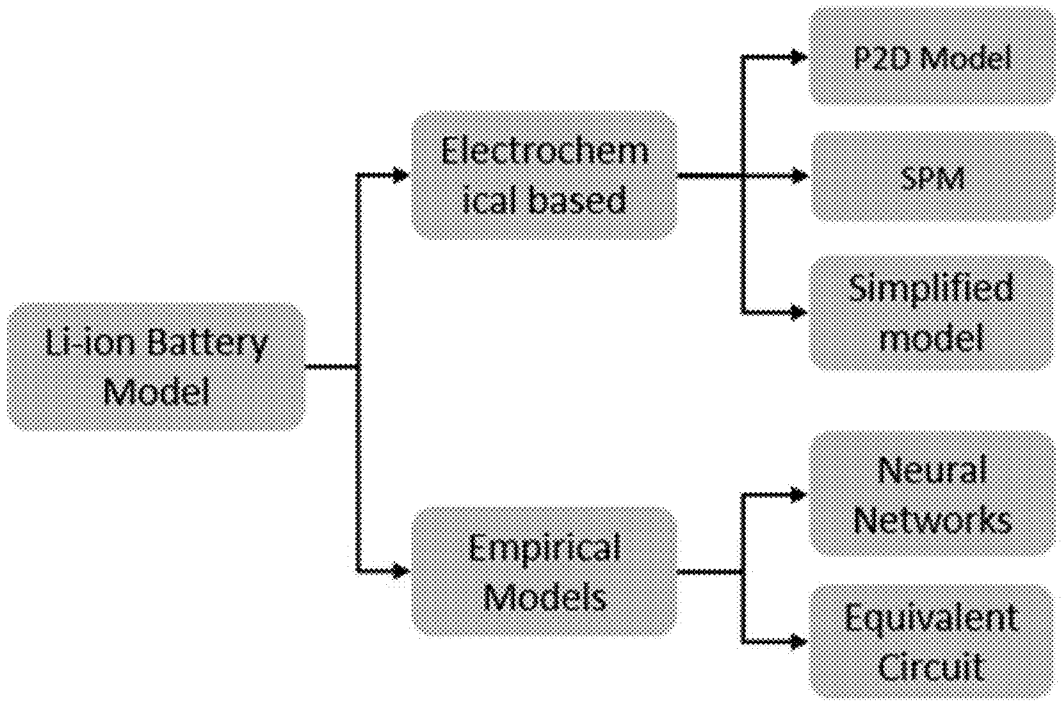
FIG. 2 shows a schematic testing regime of the current disclosure.
Figure 3:
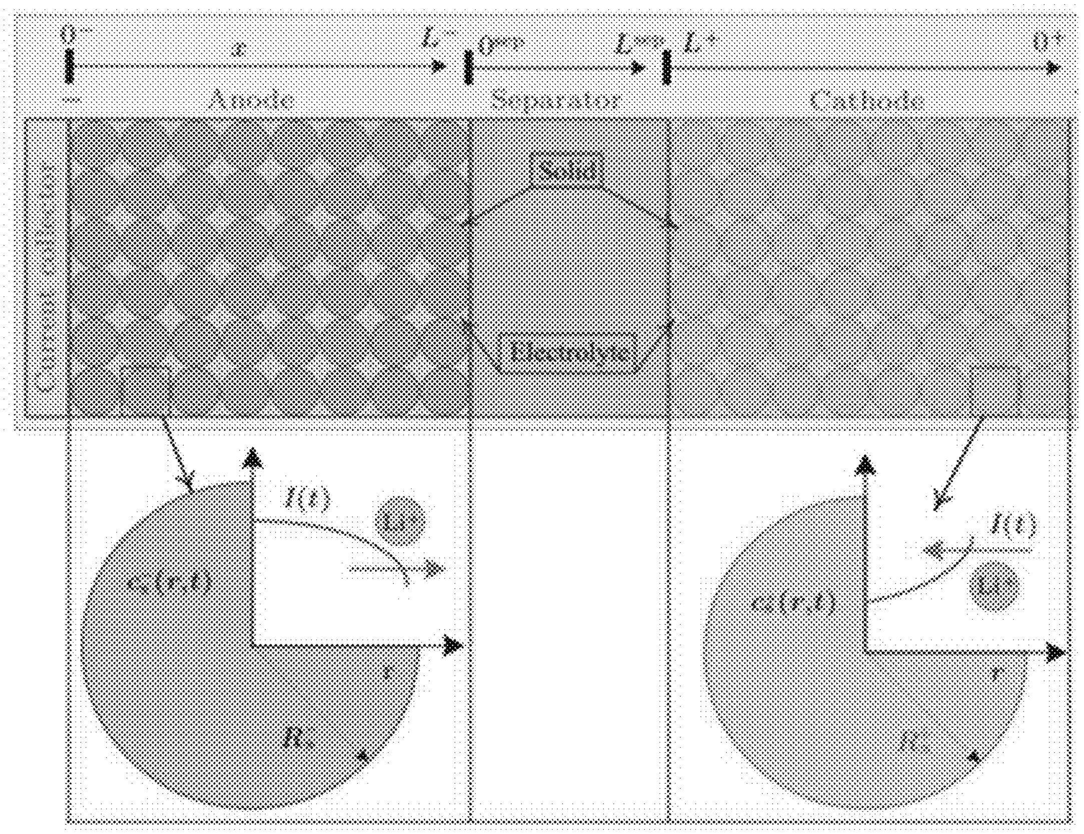
FIG. 3 shows a Lithium-ion battery P2D model.

FIG. 1 shows a comparison of computational complexity vis-à-vis model accuracy and predictability. FIG. 2 shows a schematic testing regime of the current disclosure. FIG. 3 shows a Lithium-ion battery P2D model. The electrochemical model provides two porous electrodes and a separator. Lithium in the anode is de-inserted from the active material and released as ions in the electrolyte. FIG. 3 shows Input: current I temperature T Output: voltage V Cell domain: anode, separator and cathode In each domain: solid phase and electrolyte phase.

The current disclosure works under the premise that only liquid phase and solid phase in lithium-ion battery are considered. Side reactions during operation are neglected. Active materials in solid electrodes are considered to be homogenous, and are composed of spherical particles. The effects of current collectors on lithium-ion transfer and heat transfer are neglected. The electrochemical process involves material transfer with the electrolyte (liquid phase) and spherical particle (solid phase). Charge transfer occurs on the surface of the electrode particles, the interface between the electrolyte and the electrode. Reaction current is the exchange current density (Butler-Volmer kinetics equation).

Figure 4:
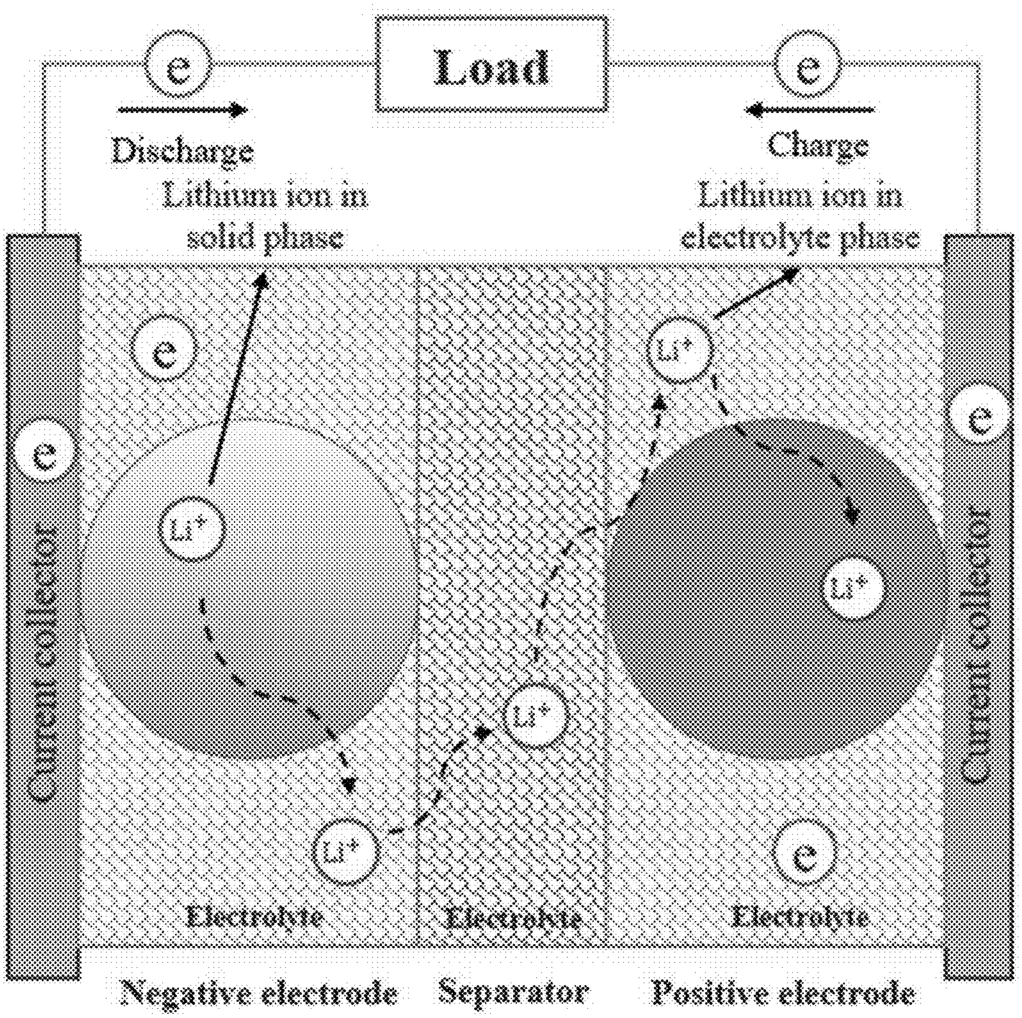
FIG. 4 shows an illustration of the solid phase of the current disclosure.

FIG. 4 shows an illustration of the solid phase of the current disclosure. The following equations apply to the SP Model:

Spherical Diffusion Equation—Fick Second Law $$\frac{\partial c_s(r,t)}{\partial t} = \frac{1}{r^2}\frac{\partial}{\partial r}\left(D_{s,i}(T)r^2\frac{\partial c_s(r,t)}{\partial r}\right)$$

$$\frac{\partial c_s(r,t)}{\partial r}\Big|_{r=0} = 0$$

$$D_{s,i}\frac{\partial c_s(r,t)}{\partial r}\Big|_{r=R_{s,j}} = -j_i(t)$$

Reaction Rate $$j_- = \frac{+I}{a_{s,-}\mathcal{F}A\delta_-} \quad j_+ = \frac{-I}{a_{s,+}\mathcal{F}A\delta_+}$$

Solid Phase Potential $$\frac{\partial \Phi_s(x,t)}{\partial x} = \frac{-i_s(x,t)}{\sigma^{eff}} = \frac{i_e(x,t) - I(t)}{\sigma^{eff}}$$

$$i_e + i_s = I$$

The electrolyte involves the following equations:

Evolution of Lithium Concentration $$\varepsilon_e\frac{\partial c_e}{\partial t} = D_e^{eff}\frac{\partial^2 c_e}{\partial x^2} + \frac{1-t_+^0}{\mathcal{F}}j^{Li}$$

$$\frac{\partial c_e}{\partial x}\Big|_{x=0^-} = \frac{\partial c_e}{\partial x}\Big|_{x=0^+} = 0$$

Electrolyte Potential $$k^{eff}\frac{\partial \phi_e}{\partial x} - k_D^{eff}\frac{\partial \ln c_e}{\partial x} + i_e = 0$$

$$k_D^{eff} = \frac{2RTk^{eff}}{\mathcal{F}}(t_+^0 - 1)\left(1 + \frac{d\ln f_\pm}{d\ln c_e}\right)$$

Electrochemical reaction kinetics per the Butler-Volmer equation. The electrochemical reactions for lithium-ion intercalation/deintercalation at the solid/solution interface:

$$\mathrm{Li} - \theta_s \rightleftarrows \mathrm{Li}^+ + e^- + \theta_s$$

Build the relationship between current density, concentrations, and over-potential (lithium-ion intercalation/deintercalation)

Molar Flux (Reaction Rate)):

$$j^{Li} = a_s i_0\left[\exp\left(\frac{\alpha_a\mathcal{F}\eta}{RT}\right) - \exp\left(\frac{\alpha_a\mathcal{F}\eta}{RT}\right)\right]$$

Exchange Current Density:

$$i_0 = k\mathcal{F}(c_s^{max} - c_s^{max})^{\alpha_a}\left(c_s^{surf}\right)^{\alpha_a}(c_e)^{\alpha_a}$$

Over-potential:

$$\eta = \phi_s - \phi_e - U\left(c_s^{surf}\right)$$

Output Equations:

$$V = \phi_s(0^+, t) - \phi_s(0^-, t) - V_R$$

$$V = (E_0^+ - \eta_+) - (E_0^- + \eta_-) - R * i_{app}$$

Figure 5:
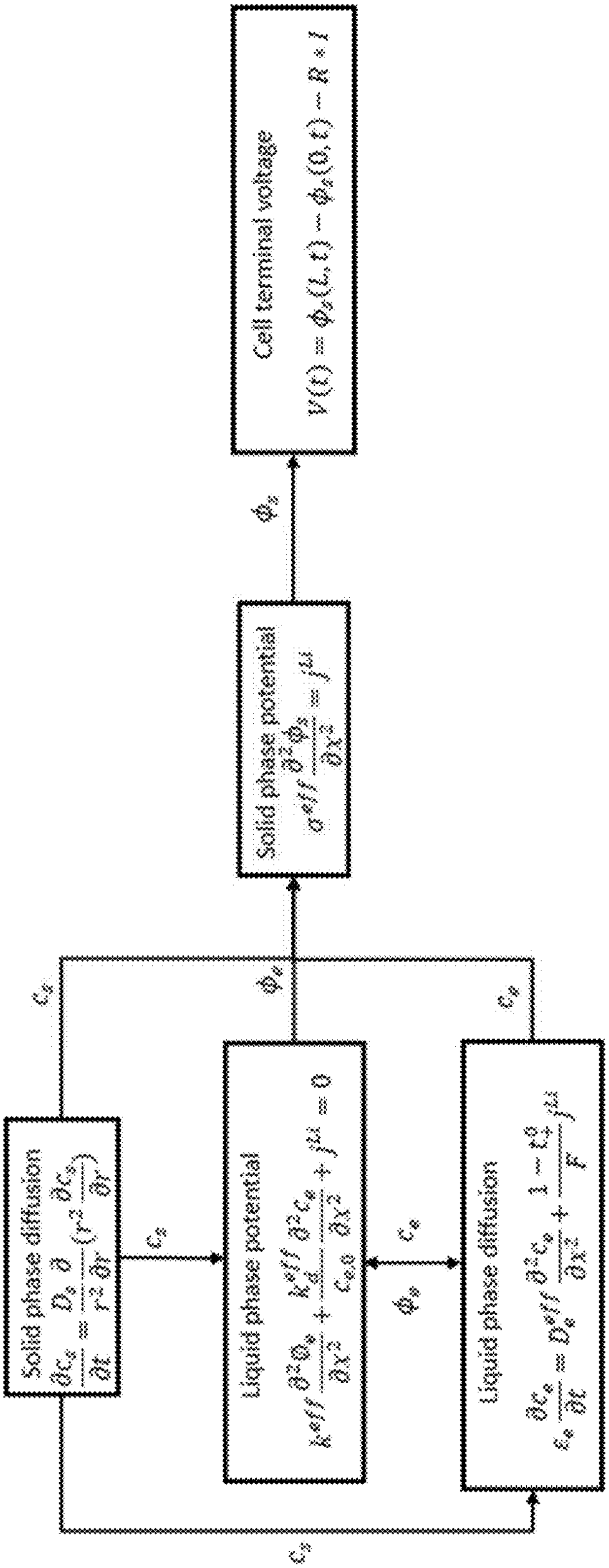
FIG. 5 shows a flowchart of the current disclosure.
Figure 6:
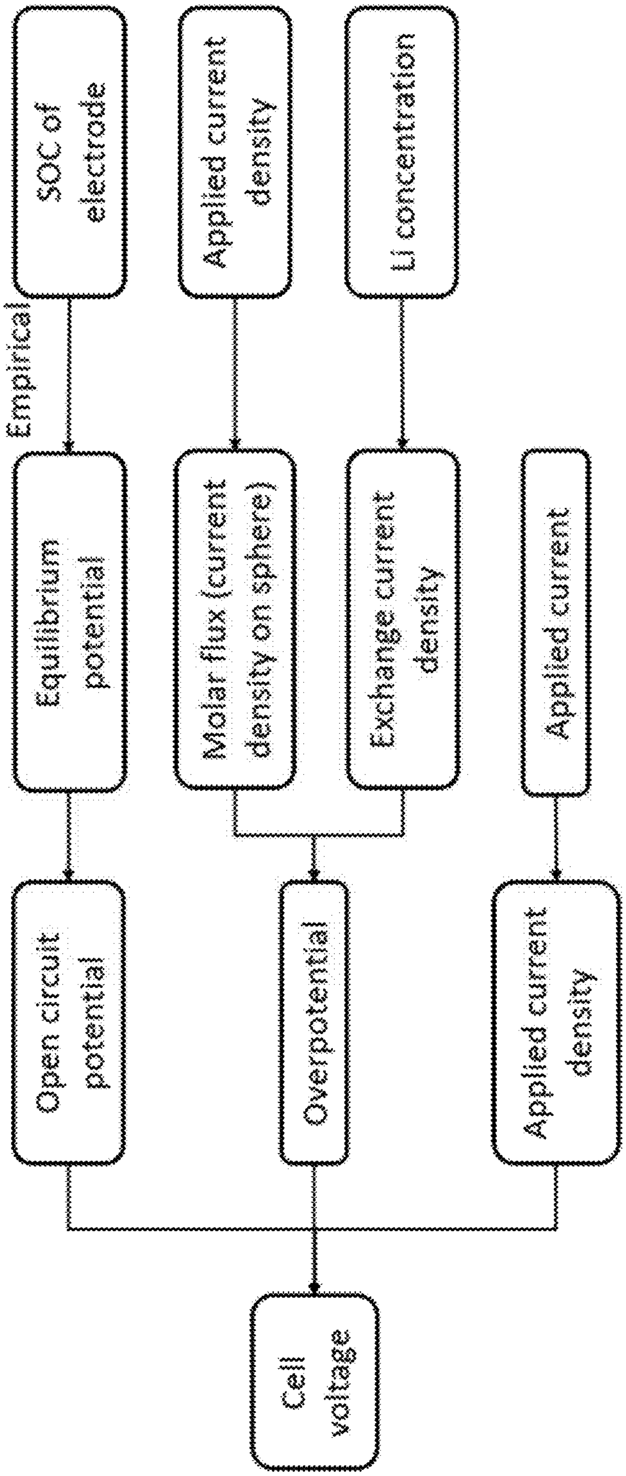
FIG. 6 shows a flowchart of the electrochemical model.

FIG. 5 shows a flowchart of the current disclosure. FIG. 6 shows a flowchart of the electrochemical model. FIG. 7 shows Table 1, Battery Reaction Parameters. FIG. 8 shows Table 2, Battery Geometric Parameters.

The current disclosure also provides a parameter estimation of the electrochemical model. This includes: (1) electrochemical measurement method (Half battery measurement); (a) electrochemical impedance spectroscopy; (b) linear sweep voltammetry; (c) potentiostatic Intermittent Titration Technique (PITT); and (d) Galvanostatic Intermittent Titration Technique (GITT). It also provides: (1) Parameter estimation (parameter identification); (a) Intelligent search algorithm (Genetic algorithm, Particle Swarm Optimization (PSO); (b) Nonlinear parameter estimation method (Nonlinear least squares, Levenberg-Marquardt optimization algorithm, Steepest descent, etc.)

The thermal model of the current disclosure provides total heat generation with reaction heat, reversible heat due to entropy changes, and Ohmic heat shown by the below formula:

$$Q_{tot} = I_{vol} * T * \frac{dU}{dT} + j * (\eta_a - \eta_c) + i_{app}^2 * Rc * As/Vc$$

The heat exchange environment is shown by the equation:

$$Q_{conv} = -(h * A * (T - \text{T\_amb}))$$

With:

h: convective heat transfer coefficient

A: battery surface per unit of battery volume

T: battery temperature

T_amb: temperature of the environment

I_vol: current per unit of battery volume

Figure 9:
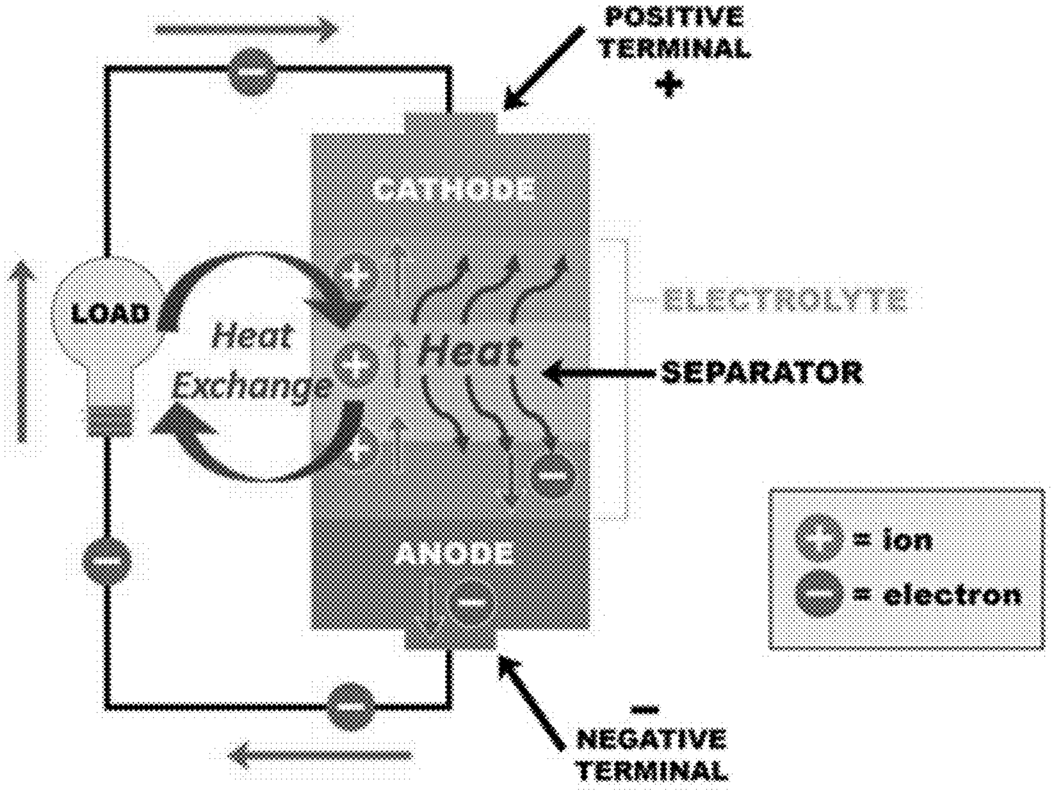
FIG. 9 shows an illustration of the current disclosure's thermal model.
Figure 10:
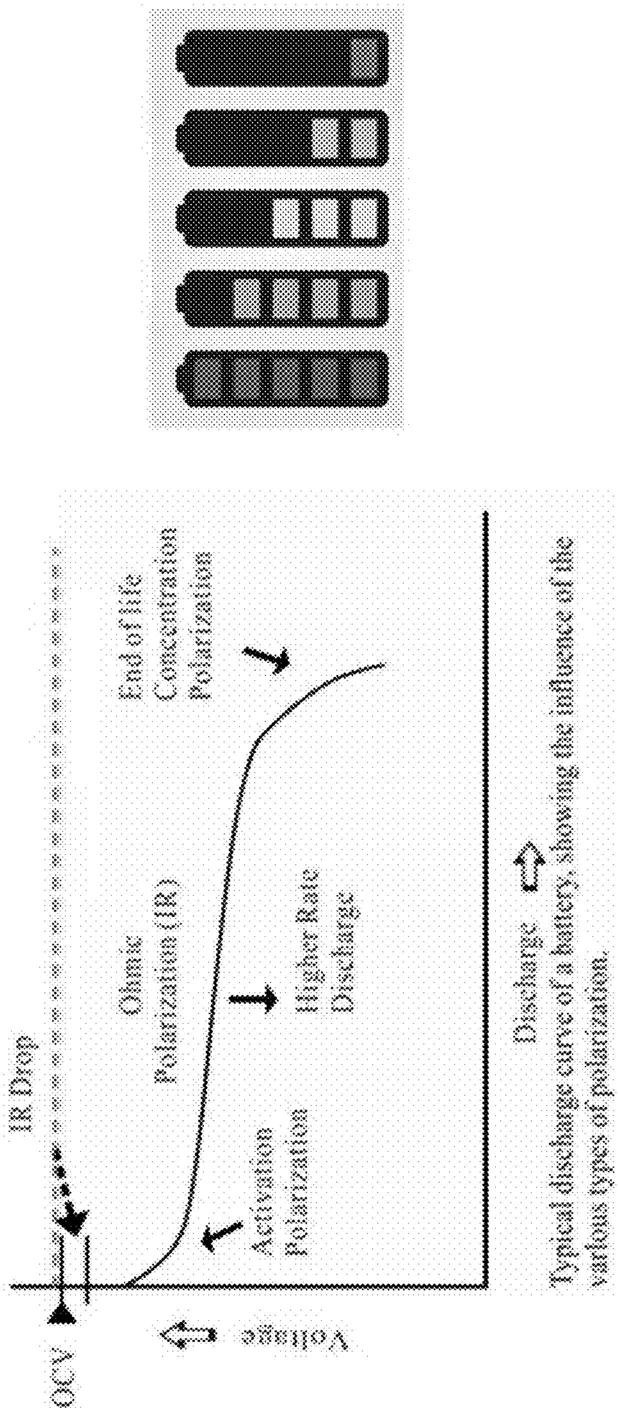
FIG. 10 shows an illustration of the discharge curve showing different polarizations.
Figure 11:
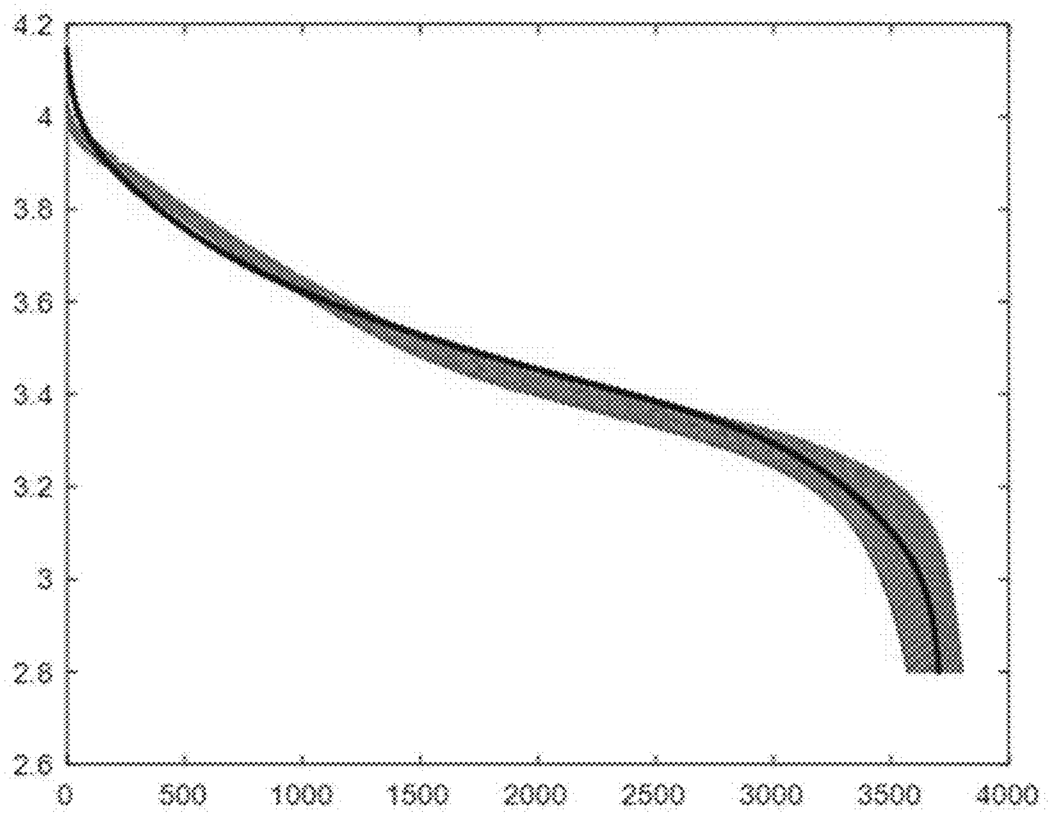
FIG. 11 shows an output curve of the disclosure.
Figure 12:
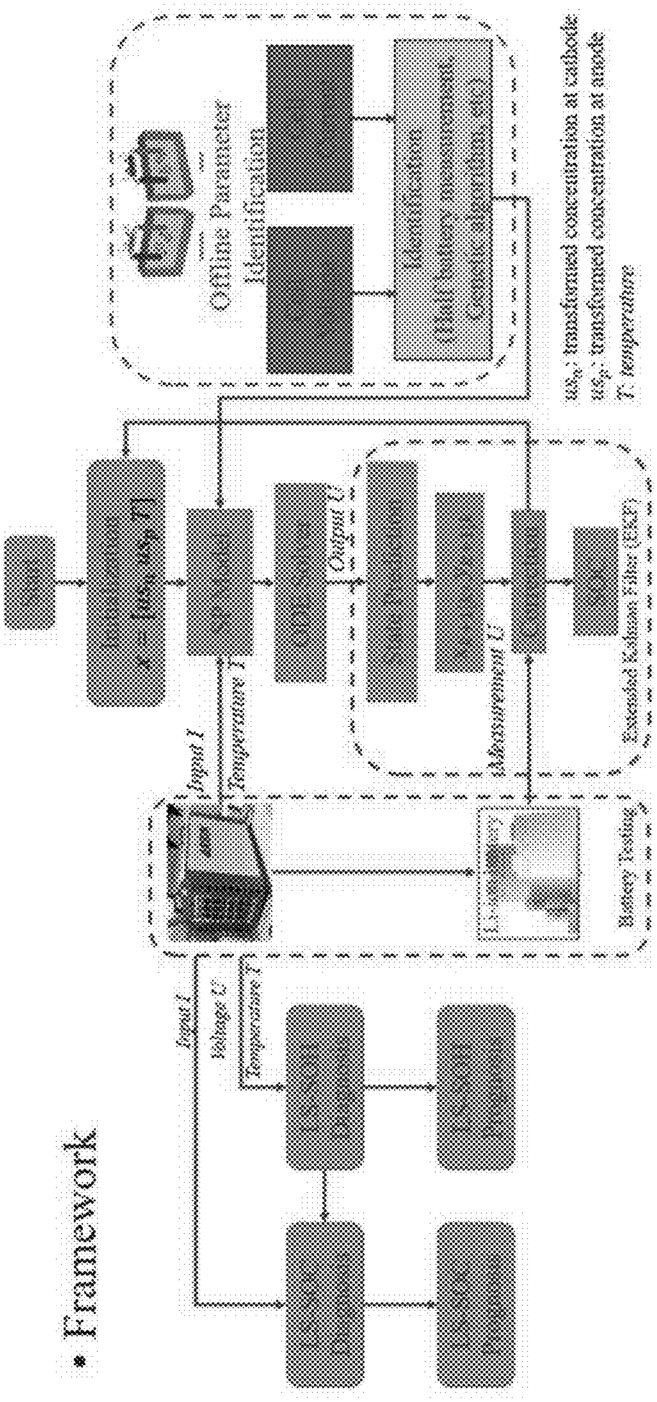
FIG. 12 shows an illustration of an SP-EKF based SOC and SOH Estimation of the current disclosure.

T: battery temperature dU/dT: entropic coefficient of reaction at current Li concentration η_a: overpotential at the anode η_c: overpotential at the cathode FIG. 9 shows an illustration of the current disclosure's thermal model. FIG. 10 shows an illustration of the discharge curve showing different polarizations. FIG. 11 shows an output curve of the following disclosure. FIG. 12 shows an illustration of an SP-EKF based SOC and SOH Estimation.

Various modifications and variations of the described methods, pharmaceutical compositions, and kits of the disclosure will be apparent to those skilled in the art without departing from the scope and spirit of the disclosure. Although the disclosure has been described in connection with specific embodiments, it will be understood that it is capable of further modifications and that the disclosure as claimed should not be unduly limited to such specific embodiments. Indeed, various modifications of the described modes for carrying out the disclosure that are obvious to those skilled in the art are intended to be within the scope of the disclosure. This application is intended to cover any variations, uses, or adaptations of the disclosure following, in general, the principles of the disclosure and including such departures from the present disclosure come within known customary practice within the art to which the disclosure pertains and may be applied to the essential features herein before set forth.

What is claimed is:

1. A method for describing battery behavior comprising:

embedding at least one microprocessor into at least one lithium-ion battery to determine battery behavior;

employing at least one particle swarm optimization parameter in the at least one lithium-ion battery;

employing a Lebesgue sampling-based Bayesian estimation framework;

estimating via a single particle model at least one state-of-charge factor and at least one state-of-health factor for a battery;

establishing a battery single particle model to determine and estimate state-of-charge and state-of-health in at least one lithium-ion battery while the at least one lithium-ion battery is online via at least one system or at least one microprocessor embedded in the at least one lithium-ion battery using battery current and temperature as inputs and battery voltage as an output providing at least one description of at least one behavior of the at least one lithium-ion battery, wherein a microprocessor incorporated into the at least on lithium-ion battery performs the Lebesgue sampling-based Bayesian estimation framework computation and displays an estimation of at least one state-of-charge factor and at least one state-of-health factor for the lithium-ion battery;

wherein providing the description of the at least one behavior of the at least one lithium-ion battery via the single particle model reduces computation with respect to the at least one microprocessor within the at least one lithium-ion battery via integrating the Lebesgue sampling-based Bayesian estimation framework;

wherein the microprocessor implements the single particle model to estimate state-of-charge and state-of-health for the at least one lithium-ion battery based on modeling material transfer in at least one liquid phase reaction and at least one solid phase reaction occurring within the at least one lithium battery and charge transfer of an interface between at least one electrolyte and at least one electrode of the at least one lithium ion battery while neglecting modeling without side reactions occurring within the at least one lithium-ion battery.

2. The method for describing battery behavior of claim 1, wherein only the liquid phase and the solid phase in the battery are evaluated.

3. The method for describing battery behavior of claim 2, wherein the solid phase is described via:

Spherical diffusion equation-Fick second law $$\frac{\partial c_s(r,t)}{\partial t} = \frac{1}{r^2}\frac{\partial}{\partial r}\left(D_{s,i}(T)r^2\frac{\partial c_s(r,t)}{\partial r}\right)$$

$$\frac{\partial c_s(r,t)}{\partial r}|_{r=0} = 0$$

$$D_{s,i}\frac{\partial c_s(r,t)}{\partial r}|_{r=R_{s,j}} = -j_i(t)$$

Reaction rate $$j_- = \frac{+I}{a_{s,-},\mathcal{F}\mathcal{A}\delta_-} \quad j_+ = \frac{-I}{a_{s,+},\mathcal{F}\mathcal{A}\delta_+}$$

Solid phase potential $$\frac{\partial \Phi_s(x,t)}{\partial x} = \frac{-i_s(x,t)}{\sigma^{eff}} = \frac{i_e(x,t) - I(t)}{\sigma^{eff}}$$

$$i_e + i_s = I.$$

4. The method for describing battery behavior of claim 2, wherein the liquid phase is described via:

Evolution of lithium concentration $$\varepsilon_e \frac{\partial c_e}{\partial t} = D_e^{eff} \frac{\partial^z c_e}{\partial x^Z} + \frac{1 - t_+^0}{\mathcal{F}} j^{Li}$$

$$\frac{\partial c_e}{\partial x}|_{x=0^-} = \frac{\partial c_e}{\partial x}|_{x=0^+} = 0$$

Electrolyte potential $$k^{eff} \frac{\partial \psi_e}{\partial x} - k_D^{eff} \frac{\partial \ln c_e}{\partial x} + i_e = 0|$$

$$k_D^{eff} = \frac{2RTk^{eff}}{\mathcal{F}} (t_+^0 - 1)\left(1 + \frac{d \ln f_\pm}{d \ln f_e}\right).$$

5. A method for simulating behavior in a lithium-ion battery comprising:

embedding at least one microprocessor into at least one lithium-ion battery to determine battery behavior;

using a single particle model to simulate lithium-ion battery behavior of at least one lithium-ion battery;

employing particle swarm optimization to identify at least one parameter of the single particle model;

implementing the single particle model in a Lebesgue sampling and Bayesian estimation framework to estimate at least state of charge and state of health for the lithium-ion battery;

establishing the battery single particle model to determine and estimate state-of-charge and state-of-health in the at least one lithium-ion battery while the at least one lithium-ion battery is online via at least one system or at least one microprocessor embedded in the at least one lithium-ion battery performing a Lebesgue sampling-based Bayesian estimation framework computation and providing and displaying the estimate of the at least state of charge and state of health for the lithium-ion battery;

wherein estimating state of charge and state of health of the at least one lithium-ion battery via the single particle model reduces computation with respect to the at least one system or at least one microprocessor via integrating the Lebesgue sampling-based Bayesian estimation framework;

wherein the microprocessor implements the single particle model to estimate state-of-charge and state-of-health for the lithium-ion battery based on material transfer in at least one liquid phase reaction and at least one solid phase reaction occurring within the at least one lithium battery and charge transfer of an interface between at least one electrolyte and at least one electrode of the at least one lithium ion battery while neglecting side reactions occurring within the at least one lithium-ion battery.

6. The method for simulating behavior in a lithium-ion battery of claim 5, wherein only the liquid phase and the solid phase in the battery are evaluated.

7. The method for describing battery behavior of claim 6, wherein the solid phase is described via:

Spherical diffusion equation-Fick second law $$\frac{\partial c_s(r,t)}{\partial t} = \frac{1}{r^z} \frac{\partial}{\partial r}\left(D_{s,i}(T) r^2 \frac{\partial c_s(r,t)}{\partial r}\right)$$

$$\frac{\partial c_s(r,t)}{\partial r}|_{r=0} = 0$$

$$D_{s,i} \frac{\partial c_s(r,t)}{\partial r}|_{r=R_{s,j}} = -j_i(t)$$

Reaction rate $$j_- = \frac{+I}{a_{s,-,} \mathcal{F} \mathcal{A} \delta_-} \quad j_+ = \frac{-I}{a_{s,+,} \mathcal{F} \mathcal{A} \delta_+}$$

Solid phase potential $$\frac{\partial \Phi_s(x,t)}{\partial x} = \frac{-i_s(x,t)}{\sigma^{eff}} = \frac{i_e(x,t) - I(t)}{\sigma^{eff}}$$

$$i_e + i_s = I.$$

8. The method for describing battery behavior of claim 6, wherein the liquid phase is described via:

Evolution of lithium concentration $$\varepsilon_e \frac{\partial c_e}{\partial t} = D_e^{eff} \frac{\partial^z c_e}{\partial x^Z} + \frac{1 - t_+^0}{\mathcal{F}} j^{Li}$$

$$\frac{\partial c_e}{\partial x}|_{x=0^-} = \frac{\partial c_e}{\partial x}|_{x=0^+} = 0$$

Electrolyte potential $$k^{eff} \frac{\partial \psi_e}{\partial x} - k_D^{eff} \frac{\partial \ln c_e}{\partial x} + i_e = 0|$$

$$k_D^{eff} = \frac{2RTk^{eff}}{\mathcal{F}} (t_+^0 - 1)\left(1 + \frac{d \ln f_\pm}{d \ln f_e}\right).$$

* * * * *